(12) United States Patent
Papananos

(10) Patent No.: US 8,183,970 B2
(45) Date of Patent: May 22, 2012

(54) INTEGRATED HIGH FREQUENCY BALUN AND INDUCTORS

(75) Inventor: Yannis Papananos, Vrilissia (GR)

(73) Assignee: Theta Microelectronics, Inc., Los Altos, CA (US)

( * ) Notice: Subject to any disclaimer, the term of this patent is extended or adjusted under 35 U.S.C. 154(b) by 4 days.

(21) Appl. No.: 12/897,446

(22) Filed: Oct. 4, 2010

(65) Prior Publication Data

US 2011/0018672 A1 Jan. 27, 2011

Related U.S. Application Data

(63) Continuation of application No. 11/821,313, filed on Jun. 22, 2007, now Pat. No. 7,808,356, which is a continuation-in-part of application No. 11/208,979, filed on Aug. 22, 2005, now Pat. No. 7,253,712.

(60) Provisional application No. 60/605,511, filed on Aug. 31, 2004.

(51) Int. Cl.
*H01F 5/00* (2006.01)
(52) U.S. Cl. ....................................................... 336/200
(58) Field of Classification Search .................. 336/200, 336/232; 257/531; 29/602.1
See application file for complete search history.

(56) References Cited

U.S. PATENT DOCUMENTS

| | | | |
|---|---|---|---|
| 4,816,784 A | 3/1989 | Rabjohn | |
| 6,097,273 A | 8/2000 | Frye et al. | |
| 6,380,821 B1 | 4/2002 | Imbornone et al. | |
| 6,396,362 B1 | 5/2002 | Mourant et al. | |
| 6,476,704 B2 | 11/2002 | Goff | |
| 6,577,219 B2 | 6/2003 | Visser | |
| 6,608,364 B2 | 8/2003 | Carpentier | |
| 6,707,367 B2 | 3/2004 | Castaneda et al. | |
| 6,801,114 B2 | 10/2004 | Yang et al. | |
| 6,882,263 B2 | 4/2005 | Yang et al. | |
| 7,088,214 B2 | 8/2006 | Castaneda et al. | |
| 7,164,339 B2 | 1/2007 | Huang | |
| 7,821,372 B2 * | 10/2010 | Ho-Hsiang | 336/200 |
| 7,880,547 B2 * | 2/2011 | Lee et al. | 330/295 |
| 7,936,215 B2 * | 5/2011 | Lee et al. | 330/195 |
| 2002/0113682 A1 | 8/2002 | Gevorgian et al. | |

* cited by examiner

*Primary Examiner* — Tuyen Nguyen
(74) *Attorney, Agent, or Firm* — Blakely Sokoloff Taylor & Zafman LLP

(57) ABSTRACT

Integrated high frequency balanced-to-unbalanced transformers and inductors suitable for operation in high frequencies, such as radio frequencies. Embodiments disclosed give consideration to issues related to the layout of the top and bottom inductors for the minimization of capacitive effects between layers and methods of manufacturing thereof. A displacement between the conductive paths of the top inductor and the bottom inductor is shown that provides for superior performance over prior art solutions.

11 Claims, 8 Drawing Sheets

Metal Layer 200

Metal Layer 100

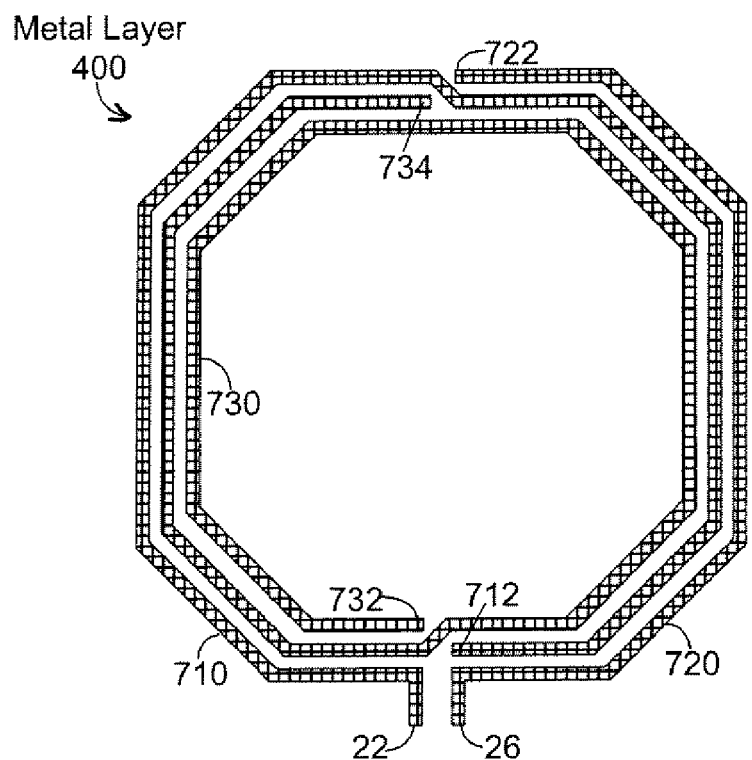
FIGURE 7
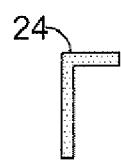
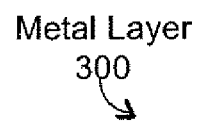
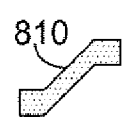
FIGURE 8　　　　　　　　　　　　　　　　FIGURE 9

INTEGRATED HIGH FREQUENCY BALUN AND INDUCTORS

CROSS-REFERENCE TO RELATED APPLICATION

This application is a continuation of U.S. patent application Ser. No. 11/821,313 filed Jun. 22, 2007 now U.S. Pat. No. 7,808,356 which is a continuation-in-part of U.S. patent application Ser. No. 11/208,979 filed Aug. 22, 2005, now U.S. Pat. No. 7,253,712, entitled "Integrated High Frequency Balanced-to-Unbalanced Transformers", which claims the benefit of U.S. Provisional Patent Application No. 60/605,511 filed Aug. 31, 2004.

STATEMENT OF SUPPORT

The work that led to the development of this invention was co-financed by Hellenic Funds and by the European Regional Development Fund (ERDF) under the Hellenic National Strategic Reference Framework (NSRF) 2007-2013, according to Contract no. MIKRO2-34 of the project "Next Generation Millimeter Wave Backhaul Radio-THETA", within the Program "Hellenic Technology Clusters in Microelectronics-Phase-2 Aid Measure".

BACKGROUND OF THE INVENTION

1. Field of the Invention

The present invention relates to semiconductor integrated circuits, and more particularly to integrated circuit inductors that are magnetically-coupled for the purpose of creating a high frequency transformer.

2. Prior Art

In wireless communications, an antenna is commonly coupled, typically by means of passive components, to a transformer. In many cases, a balanced-to-unbalanced (BALUN) transformer is used. Such a transformer allows the conversion of a single-ended signal into a differential signal and vice versa. In wireless communications, the antenna receives a single-ended radio frequency (RF) signal. The signal is converted to a differential signal using a BALUN transformer. The operation of BALUN transformers is well-known in the art, and such transformers are usually represented by the schematic 10 shown in FIG. 1A. The unbalanced side of the BALUN transformer has two ends marked 12 and 14 respectively. The balanced side of the BALUN transformer has three connections, two on each end of the inductor marked 22 and 26 respectively, and one at the center of the inductor, marked 24. The balanced side provides for a differential mode. In some cases the inductors of the transformer are wound around a core, directly impacting the mutual inductance between the primary and secondary inductors and therefore the performance of the transformer. Typically node 14 of the primary inductor and node 24 of the secondary inductor are AC grounded, as shown in FIG. 1B.

With the advent of solid state electronics, the ability to integrate components in a single semiconductor device has increased manyfold. This allows the reduction in size, power consumption, and cost, and further provides overall improvement in system performance. It is therefore natural that many attempts have been made to integrate transformers, including BALUN transformers, in order to take advantage of these features. Providing a symmetrical BALUN transformer has been known to be a challenge in the art, as specifically shown in U.S. Pat. No. 6,608,364 by Carpentier (hereinafter "Carpentier") and U.S. Pat. No. 6,707,367 by Castaneda al. (hereinafter "Castaneda"). Carpentier suggests an implementation of a BALUN transformer that has five metallization layers, therefore requiring a complex manufacturing process having many layers often restricting conductor routing over the BALUN transformer. Castaneda suggests an elaborate scheme to provide a symmetrical BALUN transformer, also requiring several layers of metal and dielectric as shown in the various Figs. of Castaneda. Another example may be found in U.S. Pat. No. 6,882,263 by Yang et al. Symmetrical primary and secondary windings of an on-chip BALUN transformer are shown. However, the issue of capacitive coupling between the primary and secondary windings is not addressed, as the windings are essentially positioned such that a maximum capacitive coupling is achieved, having a disadvantage in operation at high frequencies, for example several GHz, as the capacitive coupling will tend to short-circuit the BALUN at these higher frequencies.

As the demand for integrated circuit radios increases, many attempts have been made to integrate transformers and/or transformer BALUNs onto radio frequency integrated circuits. However, such integration has been limited due to flux leakage, capacitive coupling limits, and significant series resistance. To reduce these limitations, advances have been made in transformer IC design including coplanar interleaved transformers, toroidal and concentric transformers, overlay transformers and symmetric coplanar transformers. Coplanar interleaved transformers have the primary and secondary windings interleaved on the same integrated circuit layer, where the primary and secondary windings are constructed of planer metal traces. While coplanar interleaved transformers reduce size and are widely used, they suffer from low quality (Q) factor, small coupling coefficients, and, if used as a BALUN, the center tap is often at an undesirable location, resulting in an asymmetric geometry. As is known, asymmetry of a transformer winding causes an imbalance in the resulting differential signal and/or an imbalance in the resulting single ended signal from a differential signal.

The advent of nm-scale CMOS RFIC design poses new challenges in the design of cost-effective integrated telecommunication transceivers. Despite the fact that the geometry of active devices in such processes is significantly scaled down, passive devices do not follow: integrated resistors, capacitors and inductors, tend to occupy the same silicon area as in more conventional CMOS or BiCMOS processes. From all passive devices, the integrated inductor is obviously the most area hungry. On the other hand, real estate is much more expensive in advanced sub-micron processes such as 90 nm or—even worse—in a 65 nm technology node so the design of area effective integrated inductors becomes imperative.

Therefore, for the development of large L inductor structures, a multi-layer device is typically proposed. The conventional multi-layer inductor structure however, suffers from low self-resonance frequency mainly due to the increased inter layer parasitic capacitance: metal segments running on different layers form excellent Metal-Insulator-Metal structures that drastically affect the electrical behavior of the integrated inductor. U.S. Pat. Nos. 6,801,114 and 6,759,937 are examples for this class of solutions. While desired values may be calculated based on this solution it suffers from the limitations of the conventional multi-layer inductor structure. In particular, the vertical separation does not sufficiently overcome the parasitic capacitance that limits the high-frequency operation of the BALUN.

There is therefore a need in the art for a BALUN transformer which is essentially symmetrical, can be implemented in a minimal number of layers of metal, and still provide the electrical characteristics of a BALUN transformer, and especially a reduced capacitive coupling, for the purposes of RF applications, for example in the gigahertz range. Furthermore, there is a need in the art for a design of an area effective inductor that overcomes the deficiencies of prior art solutions. It would be further advantageous if the electrical characteristics of the inductor are of high quality, and especially the reduction of the capacitive coupling, for the purposes of high-frequency RF applications, for example in the gigahertz range.

BRIEF DESCRIPTION OF THE DRAWINGS

FIG. 7 is an exemplary layout of a symmetrical secondary inductor of the second BALUN transformer having a displacement in respect to the primary inductor.

FIG. 8 is an exemplary layout of the shunts for the primary inductor of the second BALUN transformer.

FIG. 9 is an exemplary layout of the shunts for the secondary inductor of the second BALUN transformer.

DETAILED DESCRIPTION OF THE PREFERRED EMBODIMENTS

Deficiencies of the prior art have lead to a need to provide BALUN transformers that are more efficient in their design, particularly in the number of metallization layers used for their implementation without significantly adversely affecting the BALUN transformer performance. The solution of the present invention accomplishes this target by having the windings of the primary inductor in one metal layer and the windings of the secondary inductors in another metal layer not only vertically separated from, but also horizontally displaced from the first metal layer. The displacement reduces the capacitive coupling between the primary and secondary coils. Furthermore, the implementations shown enable the use of only three or four layers of metal for a BALUN transformer. It should be noted that the displacement should be such that a substantial magnetic coupling between the primary and secondary inductors of the BALUN is still achieved to ensure the proper performance of the BALUN.

Figure 2:
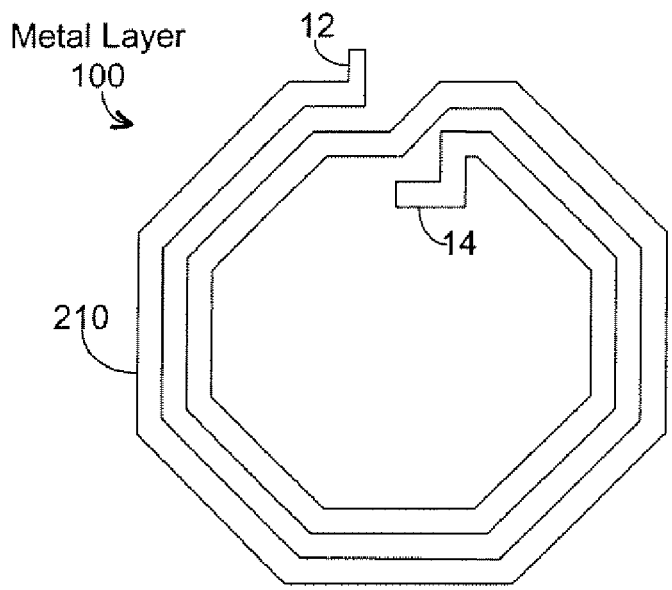
FIG. 2 is an exemplary layout of a primary inductor of a first BALUN transformer using a single metal layer.
Figure 3:
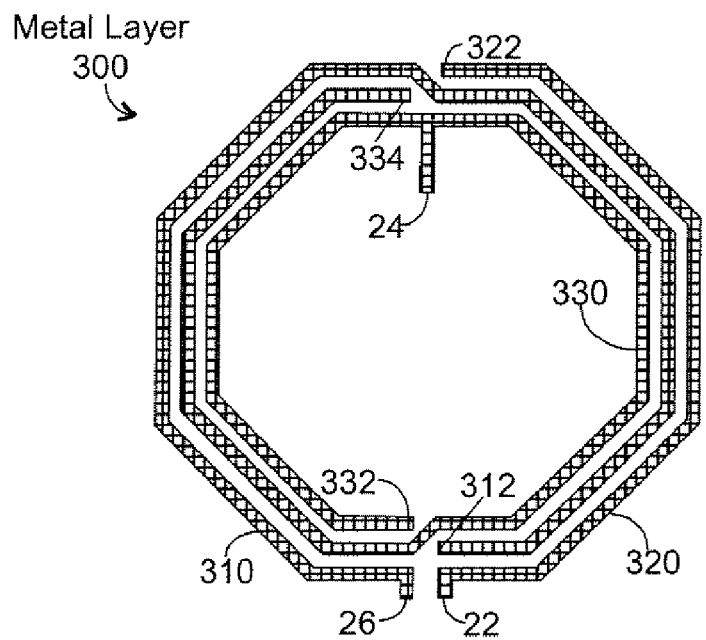
FIG. 3 is an exemplary layout of a symmetrical secondary inductor of the first BALUN transformer having a displacement with respect to the primary inductor.
Figure 4:
FIG. 4 is an exemplary layout of the shunts of the first BALUN transformer.
Figure 10:
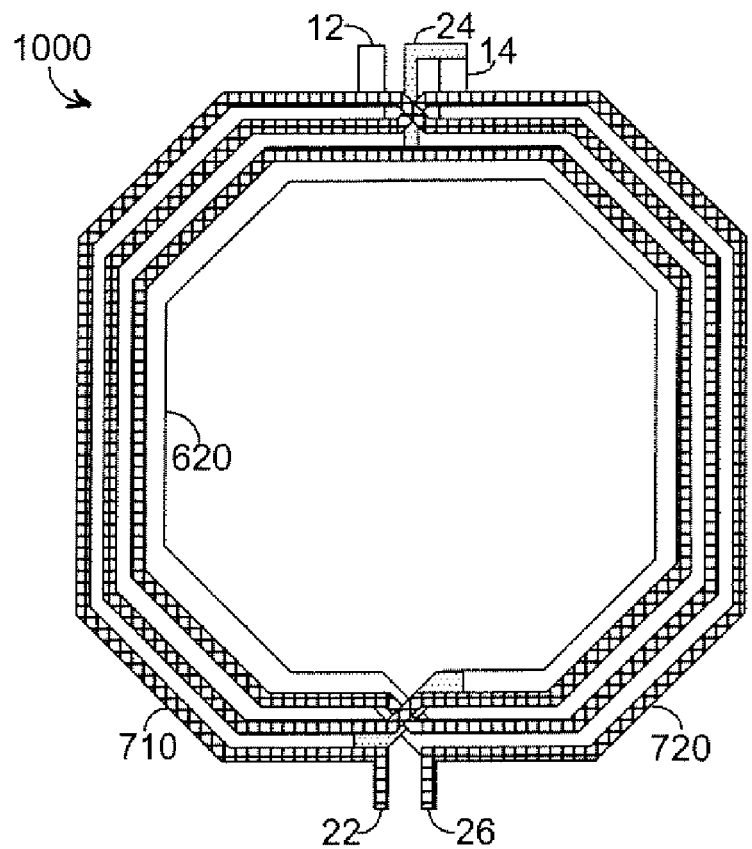
FIG. 10 is a layout of the second BALUN transformer showing the relationship between all four metal layers.

Reference is now made to FIGS. 2 through 4 where each of the three metal layers comprising a BALUN transformer 500, shown in FIG. 10, are implemented in accordance with the disclosed invention are shown. The implementation makes use of three metal layers, metal layer 100, metal layer 200, and metal layer 300. A person skilled-in-the-art will realize that it is not required that the metal layers used are consecutive metal layers, and specific choices may be made for the desired characteristics of the BALUN transformer, such as BALUN transformer 10, including, but not limited to, the grounding of both one of the nodes, for example node 14, of the primary inductor and the center node 24 of the secondary inductor.

In FIG. 2, a primary coil is composed of a continuous winding 210 and ends 12 and 14, implemented on a metal layer 100, and designed to be pseudo-symmetrical, i.e., essentially symmetrical, with a slight asymmetry when curving to implement an internal winding. In FIG. 3 a secondary coil, implemented in metal layer 300, is composed of winding segment 310 having ends 312 and 26, winding segment 320 having ends 22 and 322, and winding segment 330 having ends 332 and 334. The complete coil of the secondary coil is achieved by the use of shunt 410, connecting ends 322 and 334 of winding segments 320 and 330 respectively, and shunt 420, connecting ends 312 and 332 of winding segments 310 and 330 respectively. The shunts are shown in FIG. 4.

Figure 5:
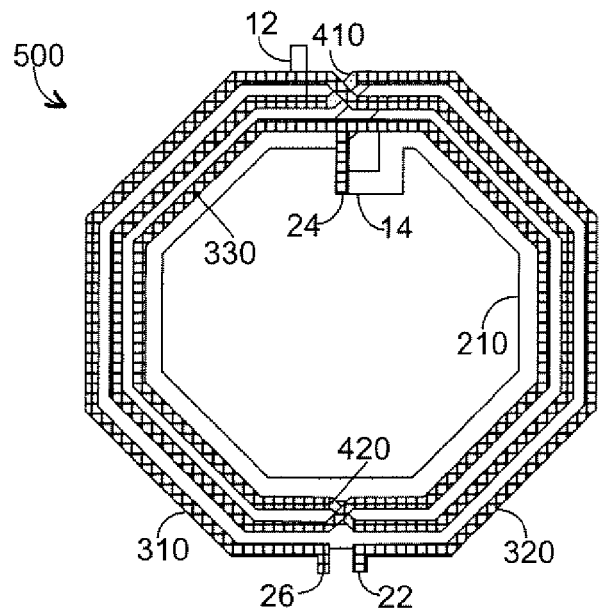
FIG. 5 is a layout of the first BALUN transformer showing the relationship between all three metal layers.

Winding segments 310, 320 and 330 of the secondary coil of FIG. 3 have a displacement with respect to winding 110 of the primary coil of FIG. 2, as explained in more detail below. The displacement reduces the horizontal overlap between the primary and secondary coils and hence reduces the capacitive coupling between them. Preferably the displacement is such that there is less than fifty percent overlap in the conductive paths between the windings of the secondary and the primary windings, excluding the shunts. A non-overlapping implementation is also possible as long as there is sufficient magnetic coupling between the primary and secondary inductors of the BALUN. In some embodiments of the disclosed invention, the input nodes of the primary inductor are physically one-hundred and eighty degrees from the outputs of the secondary inductor, further achieving symmetry. FIG. 5 shows such an embodiment, with the center tap 24 of the secondary being connected to node 14, typically both being grounded or coupled to a circuit common by a single connection thereto.

Referring now specifically to FIG. 5, a top view of the three metal layers comprising BALUN transformer 10 are shown. In one preferred embodiment, metal layer 100 is the bottom layer, metal layer 200 is the middle layer and metal layer 300 is the upper layer. In particular, the primary coil metal layer 100 would be deposited over an insulator such as silicon dioxide ($SiO_2$), for example on a substrate, typically a silicon substrate, and then patterned using conventional photolithography techniques. Notably, metal layer 100 may be any one of the metal layers available for use in the device. Then another $SiO_2$ layer is deposited, followed by the depositing and patterned of another metal layer 200 to form the shunts. A further $SiO_2$ is deposited and windows opened (etched) therein to expose the ends of the shunts for VIAs, and in the embodiment being described, an opening through the last two $SiO_2$ layers to expose node 14 of the primary inductor. Then a final metal layer is deposited and patterned, making electrical contact with the shunts the form the complete secondary winding, and providing a common connection to one primary node (14) and the center node 24 of the secondary winding. It should be further noted that it is not required that the metal layers, used in the BALUNs of the present invention, be consecutive metal layers. Hence if a semiconductor device has available a total of seven metal layers, then if three metal layers are used for the BALUN, any three of the seven metal layers may be of use.

By using this arrangement, the vertical distance between the primary coil and the secondary coil is further increased and therefore contributes to a reduction in the capacitive coupling between the coils. The primary coil is accessed at nodes 12 and 14 in metal layer 100. Since node 14 is connected to the center node 24 of the secondary inductor, it is further possible to access node 14 in metal layer 200. The secondary coil ends 22 and 26 are accessed in metal layer 300, while center node 24 of the secondary coil is accessed at end 24 in metal layer 300, as well as through node 14 in metal layer 100 as explained above.

In one alternate embodiment, the order of the layers may be reversed, namely layer 300, then layer 200 and finally layer 199. In another embodiment of the disclosed invention, metal layer 300 follows metal layer 100 in the vertical stack, with the last metal layer being metal layer 200. Connection between layers is achieved by the use of VIAs or stacked VIA holes which are well-known in the art. The inventors have noted that this implementation provides for minimal losses and has a narrowband balancing.

Typical external diameter for a BALUN transformer in accordance with the disclosed invention is between 200 and 800 micron. Spacing between turns in the primary coil is typically 5 to 10 microns, and between turns of the secondary coil is typically 5 microns. A conduction path width of the primary inductor is typically between 10 and 20 microns and the secondary inductor path width is typically 5 microns. Therefore, in a preferred embodiment of the invention, with a fifty percent overlap of the secondary with respect to the primary, only 2.5 micron of width, or less, of the secondary inductor will be in overlap with the windings of the primary inductor. The typical numbers provided herein are of course exemplary only, and are not intended to limit the scope of the disclosed invention.

Figure 1A:
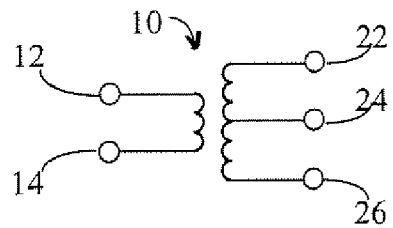
FIG. 1A is a schematic drawing of a BALUN transformer.
Figure 1B:
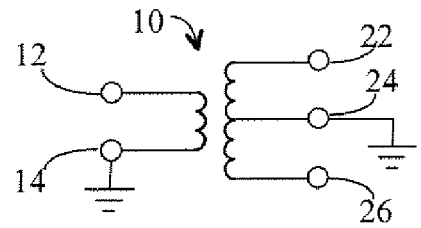
FIG. 1B is a schematic drawing of a BALUN transformer with a grounded node of the primary coil and a grounded center node of secondary coil.

Reference is now made to FIGS. 6 through 9 where each of the four metal layers comprising a BALUN transformer 1000, shown in FIG. 10 in accordance with another embodiment of the present invention are shown. This embodiment is designed to provide broadband balancing. The implementation makes use of four metal layers, metal layer 100, metal layer 200, metal layer 300, and metal layer 400. These layers are shown in FIGS. 6 through 9. A person skilled-in-the-art will realize that it is not required that the metal layers used be consecutive metal layers, and specific choices may be made to accommodate the specific characteristics of BALUN transformer 1000. The schematic of BALUN transformer 1000 is identical to the schematic shown for BALUN transformer 10 in FIG. 1B, and therefore node designation shall again remain the same.

Figure 6:
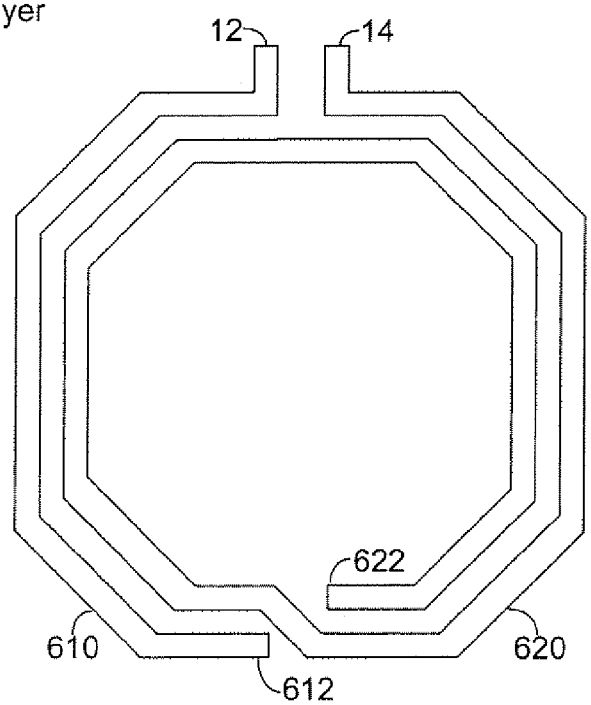
FIG. 6 is an exemplary layout of a pseudo-differential and symmetrical primary inductor of a second embodiment of BALUN transformer.

In FIG. 6, a primary coil is composed of a winding segment 610 having ends 12 and 612, and a winding segment 620 having ends 622 and 14. Winding segments 610 and 620 are implemented in a patterned metal layer 100. In FIG. 8, there is shown a shunt 810 implemented in patterned metal layer 200. Shunt 810 connects ends 612 and 622 of windings 610 and 620 respectively. By connecting winding segments 610 and 620, shunt 810 completes an implementation of a primary coil of BALUN transformer 1000, creating a pseudo-differential inductor, having only two spirals. In FIG. 7 a secondary coil is composed of winding segment 710 having ends 22 and 712, winding segment 720 having ends 26 and 722, and winding segment 730 having ends 732 and 734. Segments 710, 720 and 730 of the secondary coil of BALUN transformer 1000 are implemented in patterned metal layer 400. In FIG. 9 there are shown shunts 910 and 920 implemented in patterned metal layer 300. Shunt 910 connects ends 722 and 734 of windings 720 and 730, and shunt 920 connects ends 712 and 732 of windings 710 and 730. By connecting winding segments 710, 720 and 730, shunts 910 and 920 complete an implantation of a differential secondary coil of BALUN transformer 1000, where typically center node 24 is grounded, and connected to one of the nodes of the primary coil, for example node 14. Winding segments 710, 720 and 730 have a displacement with respect to winding segments 610 and 620 of the primary coil, as explained in more detail below. The displacement reduces the overlap between the primary and secondary coils and hence the capacitive coupling between them. Preferably the displacement is such that there is less than fifty percent overlap in conductive path width between the windings of the secondary and the primary windings, excluding the shunts. A non-overlapping implementation is also possible as long as there is sufficient magnetic coupling between the primary and secondary inductors of the BALUN. In one embodiment of the disclosed invention, the output nodes of the primary inductor are physically one-hundred and eighty degrees from the outputs of the secondary inductor, further allowing for achieving symmetry.

Referring now to FIG. 10, the four metal layers comprising BALUN transformer 1000 are shown. In one preferred embodiment, metal layer 100 is the bottom layer, metal layer 200 is a first middle layer followed by metal layer 300, and metal layer 400 is the upper layer. However, a person skilled-in-the-art would easily note that a reverse order could be used, or in fact, any order that would not cause a restriction on the connection between the different metal layers. The primary coil is accessed at ends 12 and 14 in metal layer 100. End 14 may be further accessed via node 24 of the secondary coil, connected through shunt 24 shown in FIG. 8. The secondary coil ends 22 and 26 are accessed in metal layer 400. Center node 24 of the secondary coil is accessed via metal layer 200 which is also connected, for example by use of a VIA to node 14 in metal layer 100. Connection between layers is achieved by the use of VIA or stacked VIA holes which are well-known in the art. The fabrication process in general may be similar to that previously described.

In the BALUNs of the present invention, each layer is separated from adjacent layers by an electrically insulative (dielectric) layer, preferably $SiO_2$, though other substrates and other electrically insulative layers could be used if desired. In that regard, silicon and $SiO_2$ are preferred as being most compatible with integrated circuit fabrication processes. The metal layers may be of various metals, though high electrical conductivity metals are preferred, such as aluminum, gold or silver. It should be further noted that it is not required that the metal layers, used in the BALUNs of the present invention, be consecutive metal layers. Hence if a semiconductor device has available a total of seven metal layers, then if three metal layers are used for the BALUN, any three of the seven metal layers may be of use.

The inventors have noted that the foregoing implementation provides for minimal losses and has a broadband balancing. Typical external diameter for a BALUN transformer in accordance with the disclosed invention is between 200 and 800 micron. Spacing between winds in the primary coil are typically 5 to 10 microns, and between windings of the secondary coil are typically 5 microns. A path width of the primary inductor is typically between 10 and 20 microns and the secondary inductor is typically 5 microns. Therefore, in a preferred embodiment of the invention, with a fifty percent overlap, only 2.5 micron of width, or less, of the secondary inductor conductive path will be in overlap with the windings of the primary inductor. Again, the typical numbers provided herein are exemplary purposes only and are not intended to limit the scope of the disclosed invention.

Figure 11:
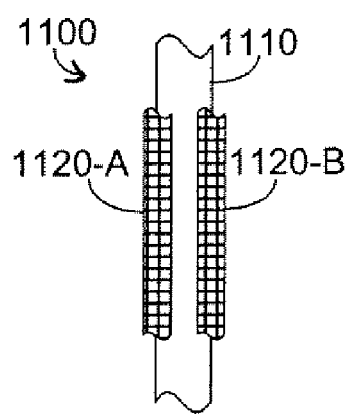
FIG. 11 is a diagram of a portion of primary coil metal layer and the secondary coil metal layer showing the displacement between the respective windings.

Reference is now made to FIG. 11 where a diagram of a first portion 1110 of a primary coil metal layer and a second portion 1120-A and a third portion 1120-B of a secondary coil metal layer are shown. The layout of the second portion and third portion is in displacement with respect to the first portion. By avoiding full coverage between the primary and secondary coils, the parasitic coupling capacity is reduced and overall performance of the BALUN transformer improved. This separation further allows the use of a wider first portion and therefore reduces the resistance of the primary inductor.

Figure 12:
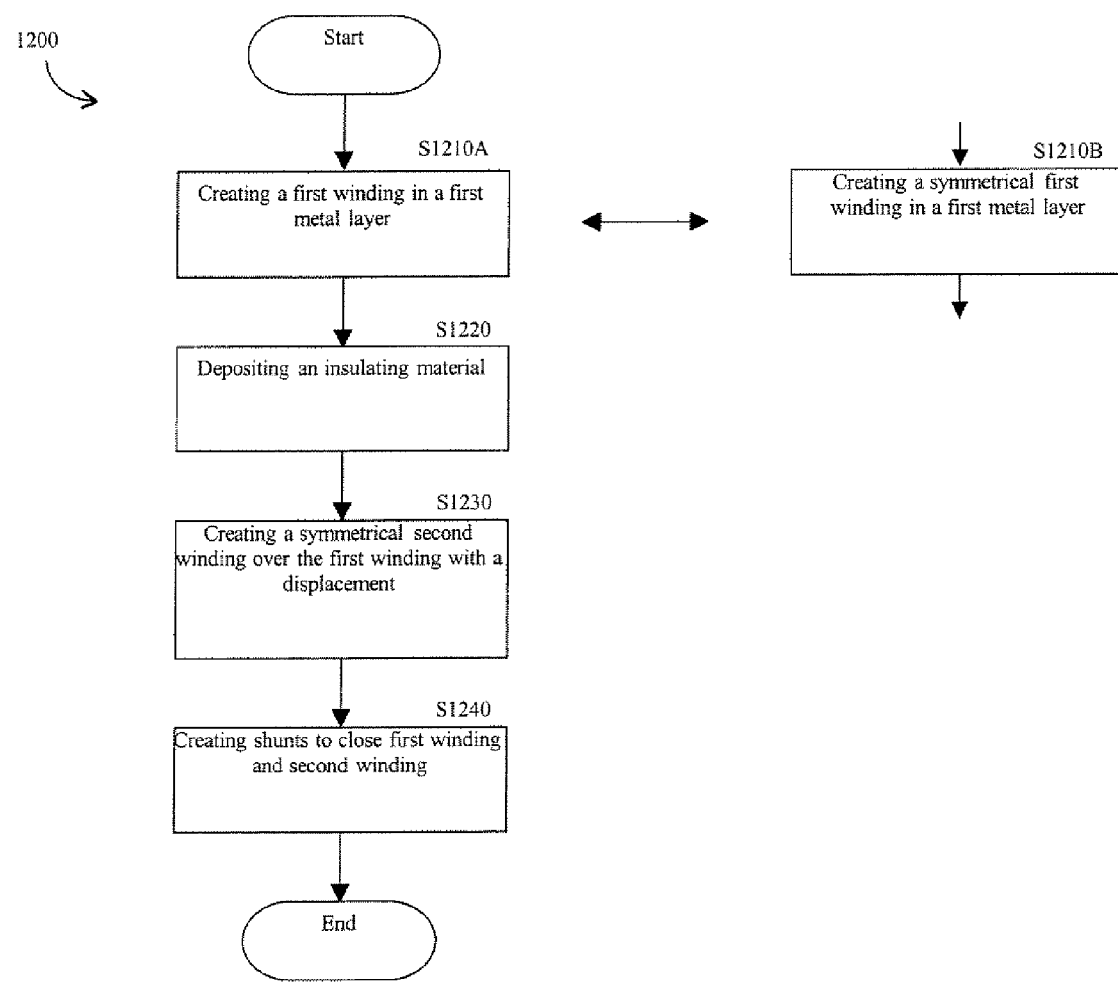
FIG. 12 is a flowchart of the process steps respective of the manufacture of the BALUN transforms in accordance with the disclosed invention.

Reference is now made to FIG. 12 where an exemplary flowchart 1200 of the process of manufacture of the BALUN transformers disclosed herein is shown. In one embodiment of the manufacturing process, in step S1210A there is created in a first metal layer an essentially pseudo-symmetrical winding. Alternatively, step S1210B is used where there is created a first winding that is symmetrical, as explained above with respect to FIG. 6. In step S1220 there is deposited a layer of non-conducting material that is an insulator between one layer of metal and another layer of metal, and has further known dielectric characteristics. Therefore, when depositing another metal plate on top of the dielectric, there will be formed a parasitic capacitor, known also as a coupling capacitance, between the two layers of metal, reducing the performance of the BALUN. In accordance with the disclosed invention, in step S1230 there is created a symmetrical second winding, as may be seen with respect to FIGS. 3 and 7, the second winding being concentric with, but horizontally displaced from the turns of the first winding. In one embodiment, the overlap between the second winding and the first winding is no more than fifty percent of the conductive path width of the second winding, excluding shunts. A non-overlapping implementation is also possible as long as there is sufficient magnetic coupling between the primary and secondary inductors of the BALUN. In some embodiments of the disclosed invention, the output nodes of the primary inductor are physically one-hundred and eighty degrees from the outputs of the secondary inductor, further providing symmetry. In step S1240, shunts are created to ensure continuous conducting paths through each of the first winding and the second winding. A person skilled in the art would readily recognize that the shunts may be created at multiple metal layers and hence the specific order shown herein should not be viewed as a limitation of the invention. Furthermore, it should be noted that the preferred manufacturing processes in general are well-known in the art, and are not provided herein in great detail in order to maintain clarity of the disclosed invention. Also while certain preferred embodiments of the present invention have been disclosed and described herein for purposes of illustration and not for purposes of limitation, it will be understood by those skilled in the art that various changes in form and detail may be made therein without departing from the spirit and scope of the invention. As an example, while in embodiments shown herein with respect of FIGS. 6, 7 and 8, where the primary inductor has two turns and the secondary inductor has three turns, other configurations may be used. For example, and without limitation to the disclosed invention, embodiments of a BALUN having three turns in the primary inductor and five turns in the secondary inductor, or, four turns in the primary inductor and seven turns in the secondary inductor, are also possible.

Figure 13A:
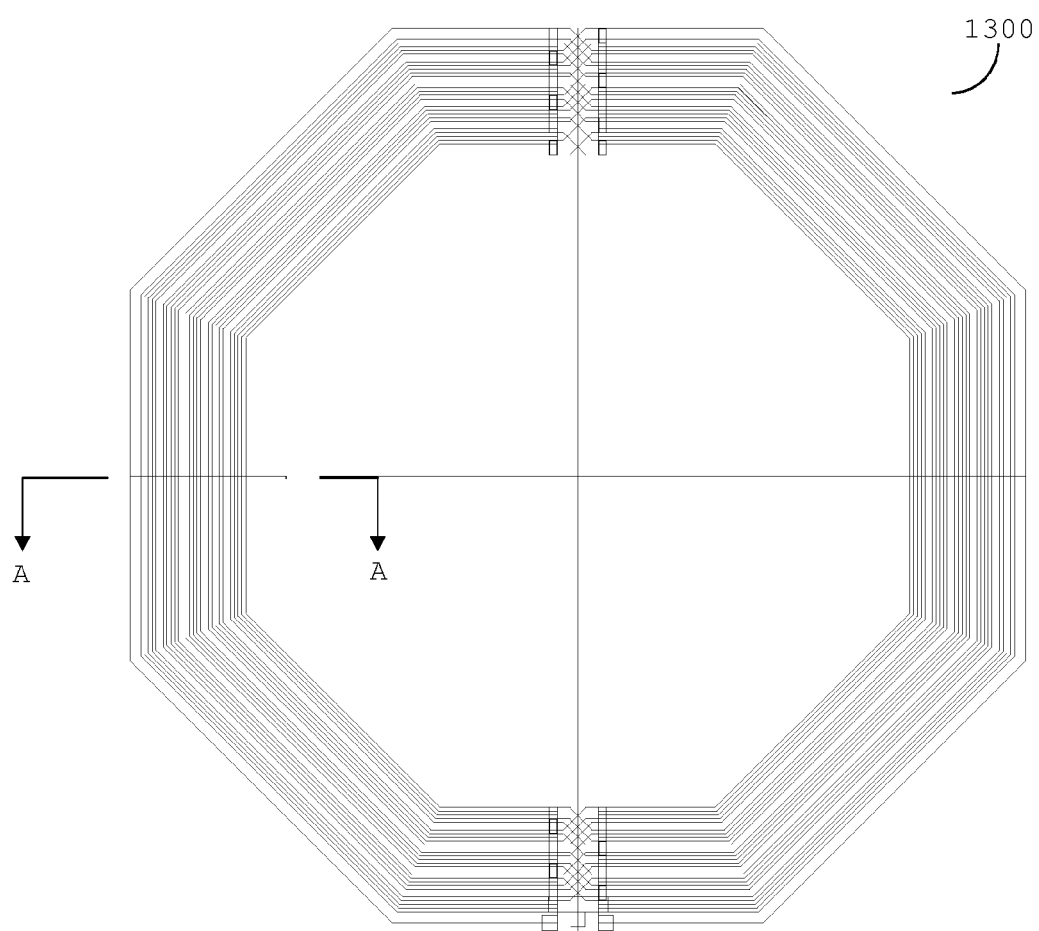
FIG. 13A is a schematic of a full 3D inductor designed in accordance with the principles of the disclosed invention.
Figure 13B:
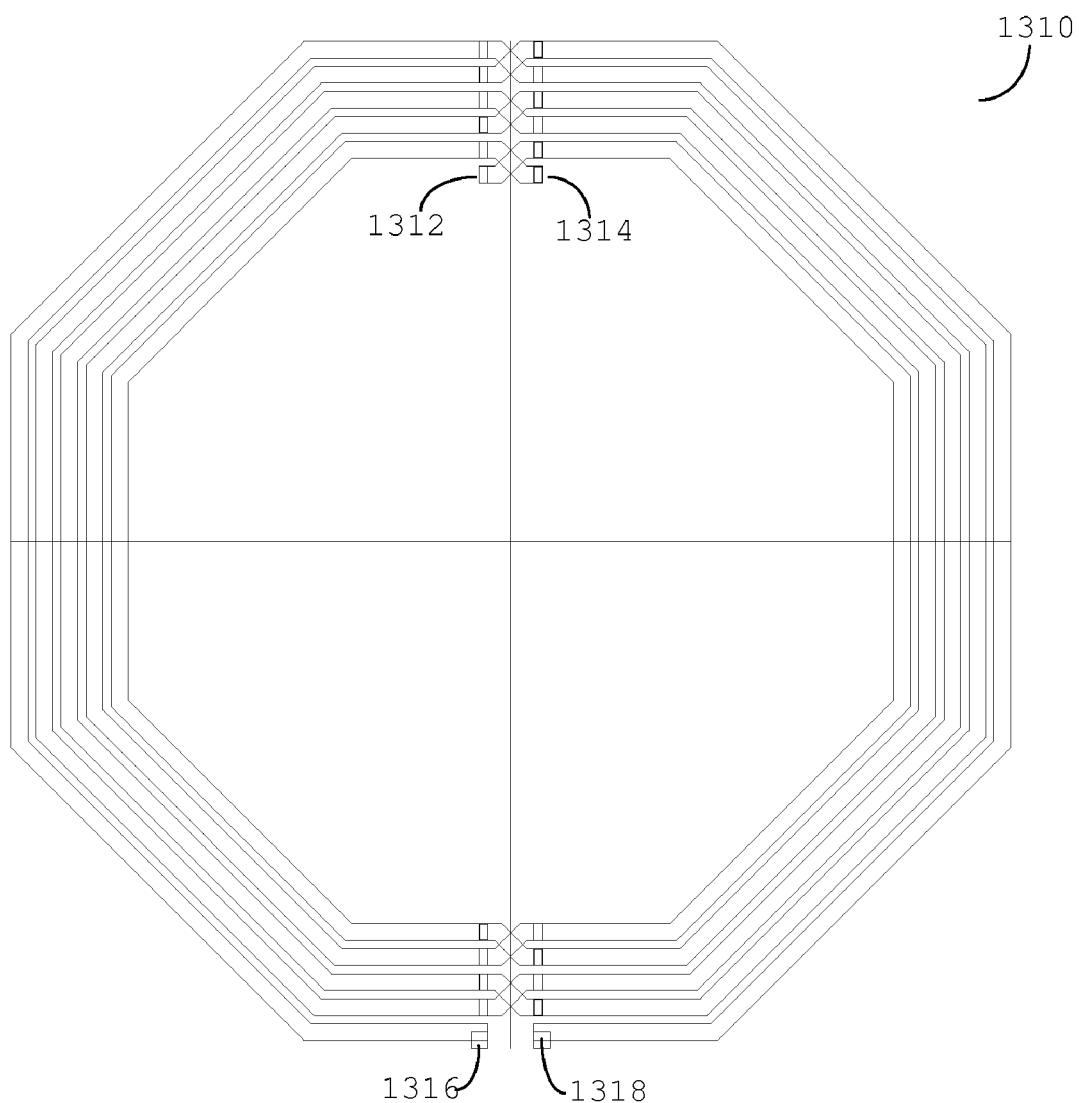
FIG. 13B is a schematic of the top part of the 3D inductor of FIG. 12.
Figure 13C:
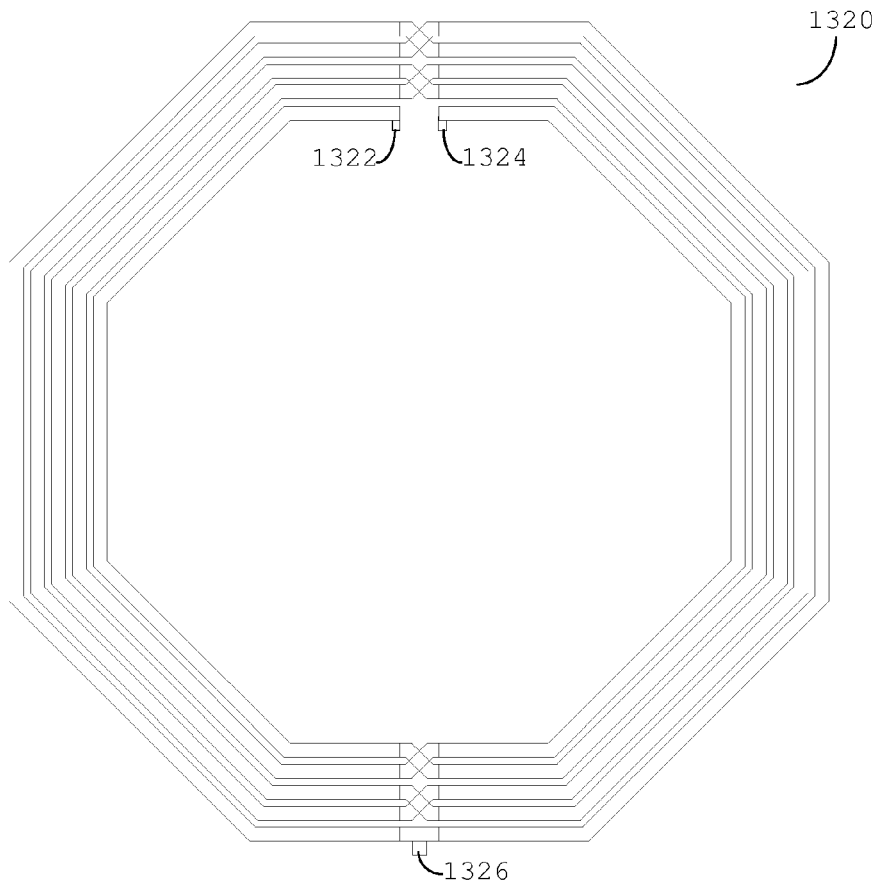
FIG. 13C is a schematic of the bottom part of the 3D inductor of FIG. 12.

The principles discussed hereinabove may be also used to design large L inductors. This way, the overlap capacitance between the different metal layers is reduced and the self-resonance frequency is not affected significantly. Reference is now made to FIG. 13A through 13C that show a large L inductor designed in accordance with the principles of the disclosed invention. FIG. 13A shows a schematic drawing of the overall "3-D" inductor 1300 structure. The inductor 1300 is comprised of a top inductor 1310, shown in FIG. 13B, and a bottom inductor 1320, shown in FIG. 13C. The top inductor 1310 generally corresponds to the upper portion discussed above with respect of the BALUN. The bottom inductor 1310 generally corresponds to the lower portion discussed above with respect of the BALUN. In accordance with the principles of the disclosed invention the winding of the top inductor is displaced with respect to the bottom inductor, thereby reducing the overlap between the metals comprising the top inductor and the bottom inductor. The reduced overlap further accounts for the reduction in the parasitic capacitance between the windings and thereby contributing to the overall superior design over prior art solutions.

The construction of a large L inductor in accordance with the principles of the disclosed invention is as follows: First the top inductor 1310 is followed from the outer winding to the inner winding. Once the inner winding is reached, a pair of metal bridge segments (not shown) transfer the spiral windings to the bottom inductor 1320 which is now deployed from the inner winding to the outer winding, each winding being in displacement to windings of the top inductor 1310. The bridges connect the edges 1312 and 1314 of the top inductor 1310 to the edges 1322 and 1324 of the bottom inductor 1320 respectively. The center tap is placed at the outer spiral of bottom part. The current flow is always in the same winding sense so the mutual inductance developed is in favor of the overall spiral inductance. The ports of the inductor are ports 1316 and 1318. The center tap 1326 in the bottom inductor is in fact the center of the large L inductor. In one embodiment of the disclosed invention the overlap between the conductive paths of the top inductor and the bottom inductor does not exceed fifty percent of the width of at least one of the conductive paths.

Figure 14:
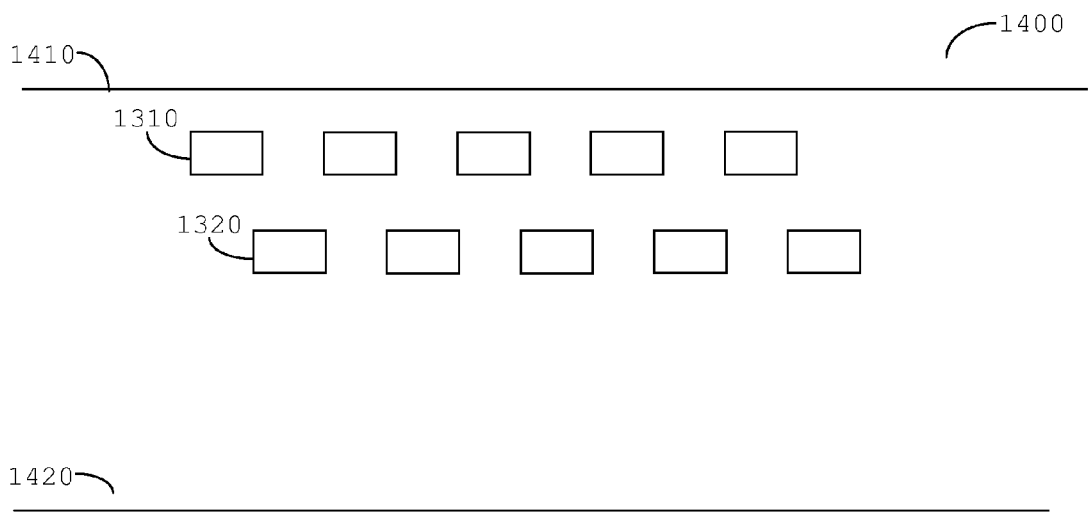
FIG. 14 shows an enlarged cross section 1400 corresponding to cross section A-A of inductor 1300 of FIG. 13A.

Reference is now made to FIG. 14 where a cross section 1400, corresponding to cross section A-A from FIG. 13A, is shown. In the enlarged cross section it can be seen, that in accordance with the principles of the disclosed inventions, the windings of the top inductor 1310 are placed in a displacement to the windings of the bottom inductor 1320. In one embodiment of the disclosed invention an inductor may be created using a sandwich of two metal layers, the effective thickness of the spiral is increased and, therefore, the quality factor of the device is kept as high as possible. Surface 1410 is the face of the portion of the integrated circuit while surface 1420 is the back side and the substrate of the integrated circuit.

While a preferred embodiment of the present invention has been disclosed and described herein for purposes of illustration and not for purposes of limitation, it will be understood by those skilled in the art that various changes in form and detail may be made therein without departing from the spirit and scope of the invention.

What is claimed is:

1. A method for manufacturing an on-chip inductor using standard manufacturing processes, the method comprising:

forming a first inductor from a first clockwise winding conductive path in a first metal layer and a first counterclockwise winding conducting path in the first metal layer, the first clockwise winding and the first counterclockwise winding conductive path being essentially symmetrical, each forming from an internal edge toward an external edge of the respective conducting path, the external edges of the first clockwise winding conductive path and the first counterclockwise winding of the conductive path being connected;

forming a first insulating layer using an insulating material;

forming shunts in a second metal layer to ensure the continuity of the first clockwise winding and the first counterclockwise winding at crossover points;

forming a second insulating layer using an insulating material;

forming a second inductor from a second clockwise winding conductive path in a third metal layer and a second counterclockwise winding in the third metal layer, the second clockwise winding and the first counterclockwise winding being essentially symmetrical, the second clockwise winding and the second counterclockwise winding being formed at a displacement from the first clockwise winding and the first counterclockwise winding, each forming from an external edge towards an internal edge of the respective conducting path;

forming a third insulating layer using an insulating material;

forming shunts in a forth metal layer to ensure the continuity of the second clockwise winding and the second counterclockwise winding at crossover points;

forming shunts to connect the internal edge of the first clockwise winding conductive path with the internal edge of the second clockwise winding conductive path; and, forming shunts to connect the internal edge of the first counterclockwise winding conductive path with the internal edge of the second counterclockwise winding conductive path;

the shunts connecting between the first inductor and the second inductor being formed such that the current flow through the inductor is always toward the same direction so the mutual inductance of the inductor is developed in favor of the overall spiral inductance.

2. The method of claim 1 further comprising:
setting the displacement to essentially result in an overlap between the conducting paths of the first inductor and the conducting paths of the second inductor not to exceed fifty percent of a width of at least one of the conducting paths.

3. The method of claim 1 further comprising:
setting the displacement to result in essentially no overlap between the conducting paths of the first inductor and the conductive paths of the second inductor.

4. The method of claim 1 further comprising:
forming a center tap of the inductor at the connection point of the external edges of the first clockwise winding conductive path and the first counterclockwise winding conductive path.

5. The method of claim 1 further comprising:
forming a first port and a second port to the inductor, the first port and the second port connected to an external edge of the second inductor.

6. The method of claim 1 further comprising:
forming at least one of the first metal and the third metal from two layers of metal connected in parallel by a plurality of shunts.

7. A device formed in an integrated circuit (IC) comprising:
a first winding conductive path formed in a first metal layer of the IC, the first winding conductive path being at least a portion of a spiral; and
a second winding conductive path formed in a second metal layer of the IC and essentially insulated by at least an insulating layer formed over the first metal layer, the second winding conductive path being at least a portion of a spiral;
the conductive path of the first winding and the conductive path of the second winding formed to be horizontally displaced from each other to reduce capacitive coupling between the first winding and the second winding;
wherein the displacement provides an overlap between the first winding conductive path and the second winding conductive path that does not to exceed fifty percent of at least one of the width of the first winding conductive path and the second winding conductive path.

8. The device of claim 7, wherein said first winding and said second winding form at least a portion of a balanced-to-unbalanced (BALUN) transformer.

9. The device of claim 7, wherein said first winding and said second winding form at least a portion of an inductor.

10. The device of claim 7, further comprising shunts to create a conductive path at intersection points of any one of: first winding, second winding.

11. The device of claim 7, wherein the displacement provides for no overlap between the first winding conductive path and the second winding conductive path.

* * * * *